United States Patent [19]

Shinonaga et al.

[11] Patent Number: 4,733,122
[45] Date of Patent: Mar. 22, 1988

[54] ACOUSTIC SURFACE WAVE FILTER BANK

[75] Inventors: Hideyuki Shinonaga, Saitama; Yasuhiko Ito, Tokyo, both of Japan

[73] Assignee: Kokusai Denshin Denwa Co., Ltd., Tokyo, Japan

[21] Appl. No.: 923,546

[22] Filed: Oct. 27, 1986

[30] Foreign Application Priority Data

Nov. 1, 1985 [JP] Japan .................. 60-244106

[51] Int. Cl.$^4$ ............................................. H01L 41/08
[52] U.S. Cl. .................. 310/313 R; 333/194
[58] Field of Search ............... 310/313; 333/150–155, 333/193–196, 1, 12, 133, 186

[56] References Cited
U.S. PATENT DOCUMENTS

| 4,016,517 | 4/1977 | Sahasrabudhe et al. | 333/186 X |
| 4,114,119 | 9/1978 | Sandy et al. | 333/195 |
| 4,647,881 | 3/1987 | Mitsutsuka | 310/313 R X |

Primary Examiner—Mark O. Budd
Attorney, Agent, or Firm—Armstrong, Nikaido, Marmelstein & Kubovcik

[57] ABSTRACT

An acoustic surface wave filter bank consisting of a single or a plurality of piezoelectric substrates on which a plurality of acoustic surface wave filters each comprising an input interdigital transducer and an output interdigital transducer are fabricated, wherein center frequencies of adjacently located filters are not adjacent to center frequency of present filter so that leaked acoustic surface waves to the present filter from adjacently located filters are strongly attenuated.

4 Claims, 15 Drawing Figures

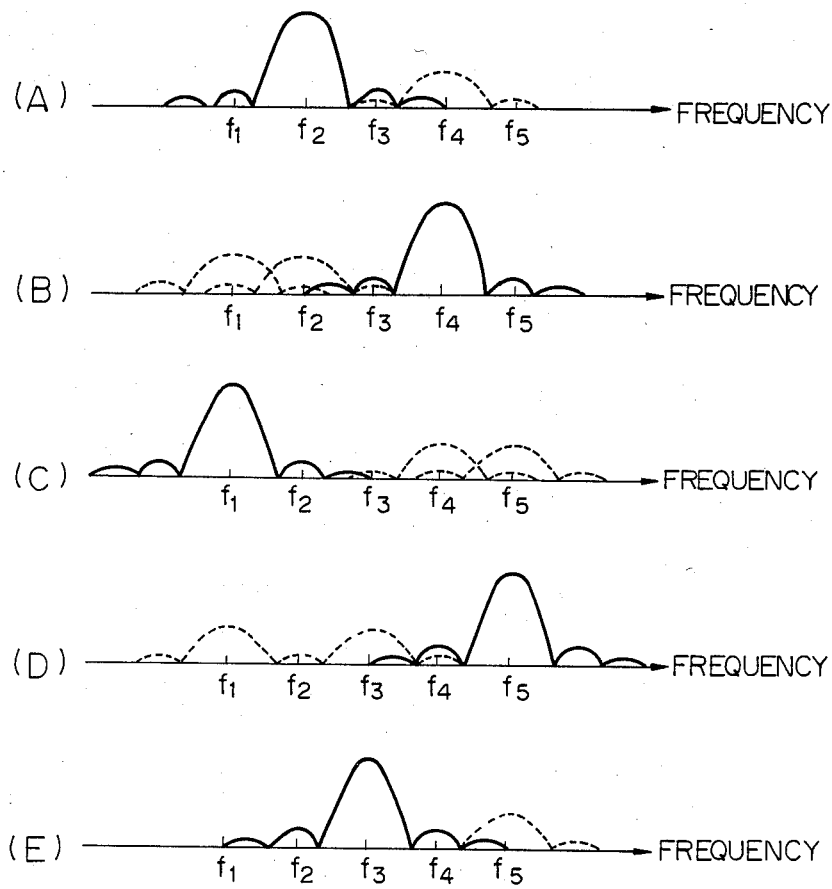

ACOUSTIC SURFACE WAVE FILTER BANK

BACKGROUND OF THE INVENTION

The present invention relates to a structure of an acoustic surface wave filter bank.

An acoustic surface wave filter bank consists of a single or a plurality of piezoelectric substrates on which a plurality of acoustic surface wave filters each comprising input and output interdigital electrodes are fabricated. As the size of the filter bank is small, the application field of a filter bank has recently grown, and the requirement for the miniaturization and the improvement of electrical performance has been increased.

Conventionally, an acoustic surface wave filter bank consisting of a plurality of acoustic surface wave filters with different center frequencies allocates the filters in a package in order of center frequency.

FIG. 1 shows a prior arrangement of filters, in which five filters $F_1$, $F_2$, $F_3$, $F_4$ and $F_5$ are included. In the figure, the numerals 1, 2, 3, 4 and 5 are input transducers of the filters $F_1$, $F_2$, $F_3$, $F_4$ and $F_5$, respectively, the numerals 6, 7, 8, 9 and 10 are output transducers of the filters $F_1$, $F_2$, $F_3$, $F_4$ and $F_5$, respectively, and 11 is a piezoelectric substrate. FIG. 1A is the embodiment where five filters are fabricated on one substrate, FIG. 1B is the embodiment where two substrates are used so that first group of filters $F_1$, $F_2$ and $F_3$ are fabricated on a first substrate and second group of filters $F_4$ and $F_5$ are fabricated on a second substrate. FIG. 1C is the embodiment where each filter $F_1$ through $F_5$ is fabricated on a related individual substrate.

When an acoustic surface wave filter bank is used as a frequency de-multiplexer or a frequency multiplexer, the input transducers 1, 2, 3, 4 and 5 are interconnected considering impedance matching.

FIG. 2 shows ideal frequency response of the acoustic surface wave filter bank in which the horizontal axis shows frequency and the vertical axis shows amplitude. In the figure, the numerals 12, 13, 14, 15 and 16 are amplitude responses of the filters $F_1$, $F_2$, $F_3$, $F_4$ and $F_5$ each of which has the center frequency $f_1$, $f_2$, $f_3$, $f_4$ and $F_5$, respectively. FIG. 2 does not show sidelobes for the sake of simplicity of the drawing. FIG. 3 shows detailed amplitude response to the filter $F_3$ with sidelobes.

However, a prior acoustic surface wave filter bank has the disadvantage that the filter response of each filter is affected by the adjacently located filters, because the center frequency of each filter is very close to the center frequency of the adjacently located filters. As a result, ripples in amplitude and phase appear in pass bands of filters, and the attenuation level in the out of band region becomes insufficient. Thus, the response of a filter bank becomes unsatisfactory.

The above problem is described in detail in accordance with FIG. 4, which shows the propagation of acoustic surface waves in the filter bank.

In FIG. 4, the solid lines show desired direction of propagation, and the dotted lines show undesired direction of propagation from adjacently located filters. For instance, the output transducer 8 of the filter $F_3$ receives not only the desired acoustic surface wave generated by the input transducer 3, but also the undesired leakage waves which are generated by the input transducers 2 and 4 of the adjacently located filters $F_2$ and $F_4$. Of course, there exist other leakage waves from input transducers of the other filters which are not adjacently located. However, the level of those leakage waves are so small that those waves are not shown in FIG. 4.

It should be noted that the filter characteristics of an acoustic surface wave filter is the product of the filter characteristics of an input transducer and the filter characteristics of an output transducer. Hence, the frequencies of the desired wave and the leaked waves become adjacent to each other, if the center frequencies of the adjacently located filters are adjacent to each other as in the conventional filter bank. For example, the output transducer 8 of the filter $F_3$ in FIG. 4 receives three acoustic surface waves with frequency responses shown in FIG. 5. In FIG. 5, curve 17 shows the frequency response of the acoustic surface wave generated by the input transducer 3 of the filter $F_3$, and curves 18 and 19 show the frequency responses of the acoustic surface waves which are generated by the input transducers 2, 4 of the filters $F_2$, $F_4$ and leaked to the output transducer 8 of the filter $F_3$.

These three acoustic surface waves received by the output transducer 8 are further shaped by the filter characteristics of the output transducer 8. For instance, when three acoustic surface waves shown in FIG. 5 are received by the output transducer 8 of the filter $F_3$, the final characteristics of the filter become as shown in FIG. 6. In comparing the ideal characteristics shown in FIG. 3 with the actual characteristics in FIG. 6, it should be noted that the curve of FIG. 6 has a ripple in the pass band because of the undesired leakage, and further the attenuation in the out of band region is not sufficient, therefore, the characteristics of the filter bank are considerably distorted.

The distortion of the filter characteristics of an acoustic surface wave filter bank is in particular large when the filters are located in a package very close to each other, which restricts the miniaturization and the performance improvement of an acoustic surface wave filter bank.

SUMMARY OF THE INVENTION

It is an object of the present invention to overcome the disadvantages and limitations of a prior acoustic surface wave filter bank by providing a new and improved acoustic surface wave filter bank.

It is also an object of the present invention to provide an acoustic surface wave filter bank with excellent characteristics by minimizing the effects of leaked waves from adjacently located filters.

The above and other objects are attained by an acoustic surface wave filter bank having at least one piezoelectric substrate on which an acoustic surface wave filter comprising an input interdigital transducer and an output interdigital transducer are fabricated, center frequencies ($f_1$, $f_2$, $f_3$, $f_4$, $f_5$; $f_1 < f_2 < f_3$ $f_4 < f_5$) of each acoustic surface wave filter being different from that of the others, wherein the center frequency of adjacently located filter is not adjacent to center frequency of present filter.

BRIEF DESCRIPTION OF THE DRAWINGS

The foregoing and other objects, features, and attendant advantages of the present invention will be appreciated as the same become better understood by means of the following description and accompanying drawings wherein;

FIG. 7 shows the frequency characteristics of acoustic surface waves which are received by the respective output transducers in an acoustic surface wave filter bank according to the present invention.

DESCRIPTION OF THE PREFERRED EMBODIMENTS

Figure 1A:
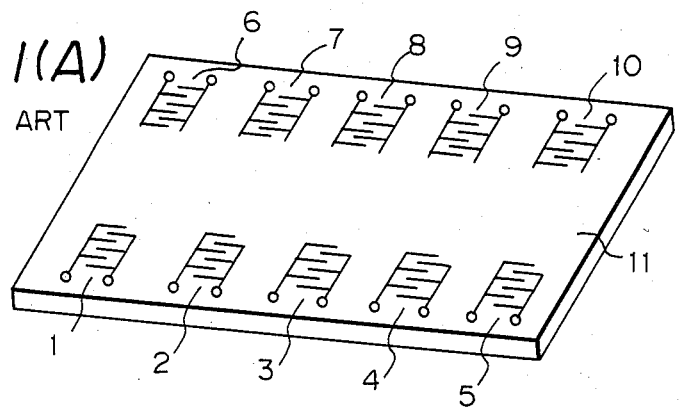
FIGS. 1A, 1B and 1C show structure of an acoustic surface wave filter bank of a prior art.
Figure 1B:
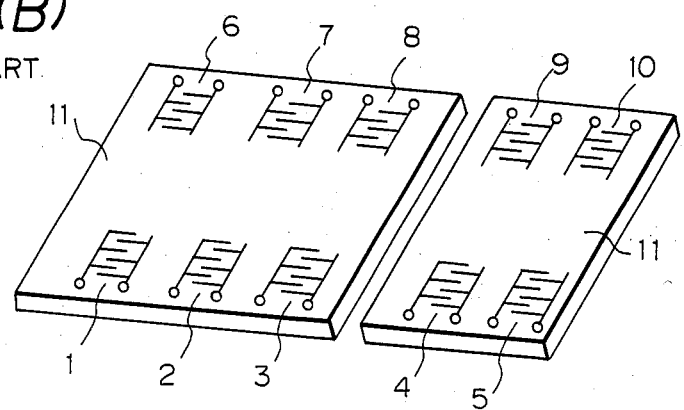
Figure 1C:
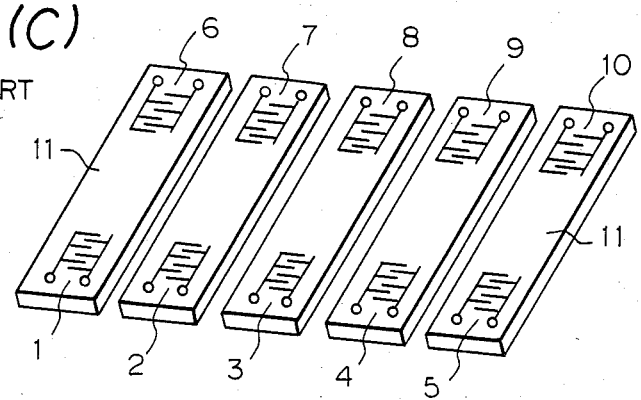
Figure 2:
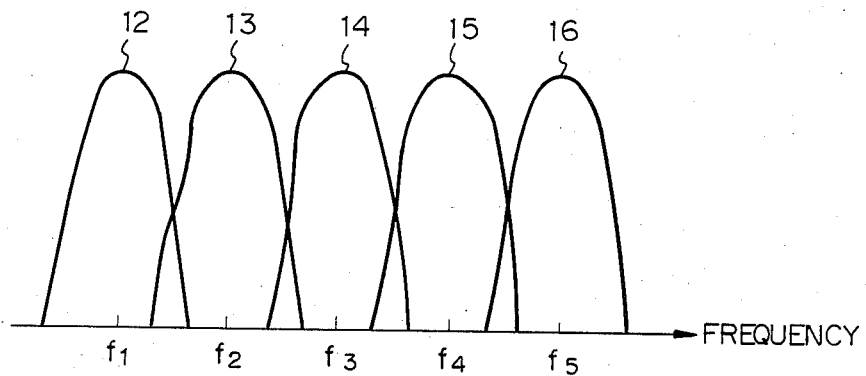
FIG. 2 shows a ideal frequency response of an acoustic surface wave filter bank.
Figure 3:
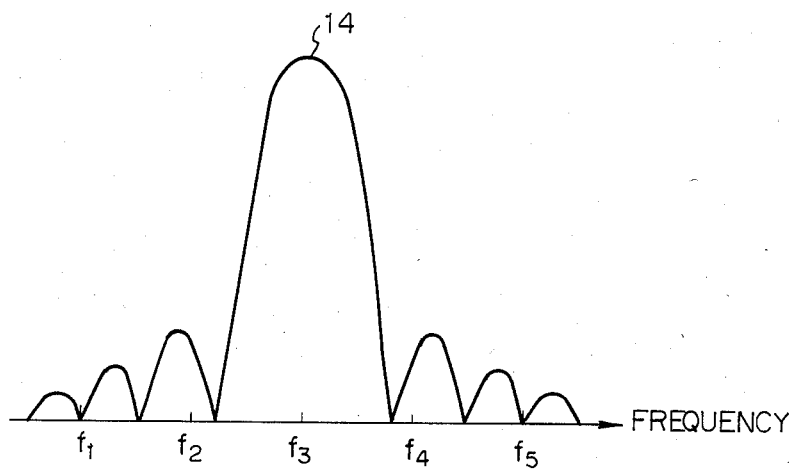
FIG. 3 shows a detailed frequency response of one channel of an acoustic surface wave filter bank.
Figure 4:
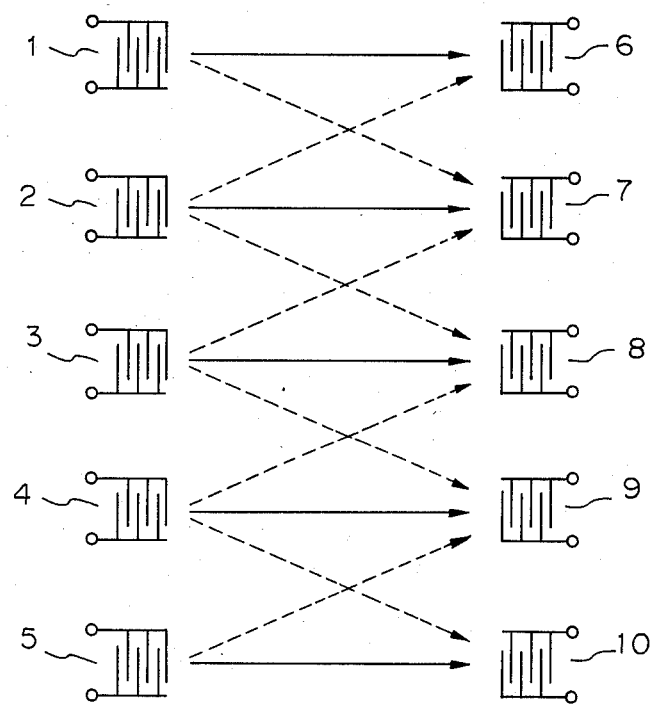
FIG. 4 shows the propagation of acoustic surface waves in an acoustic surface wave filter bank.
Figures 5, 6:
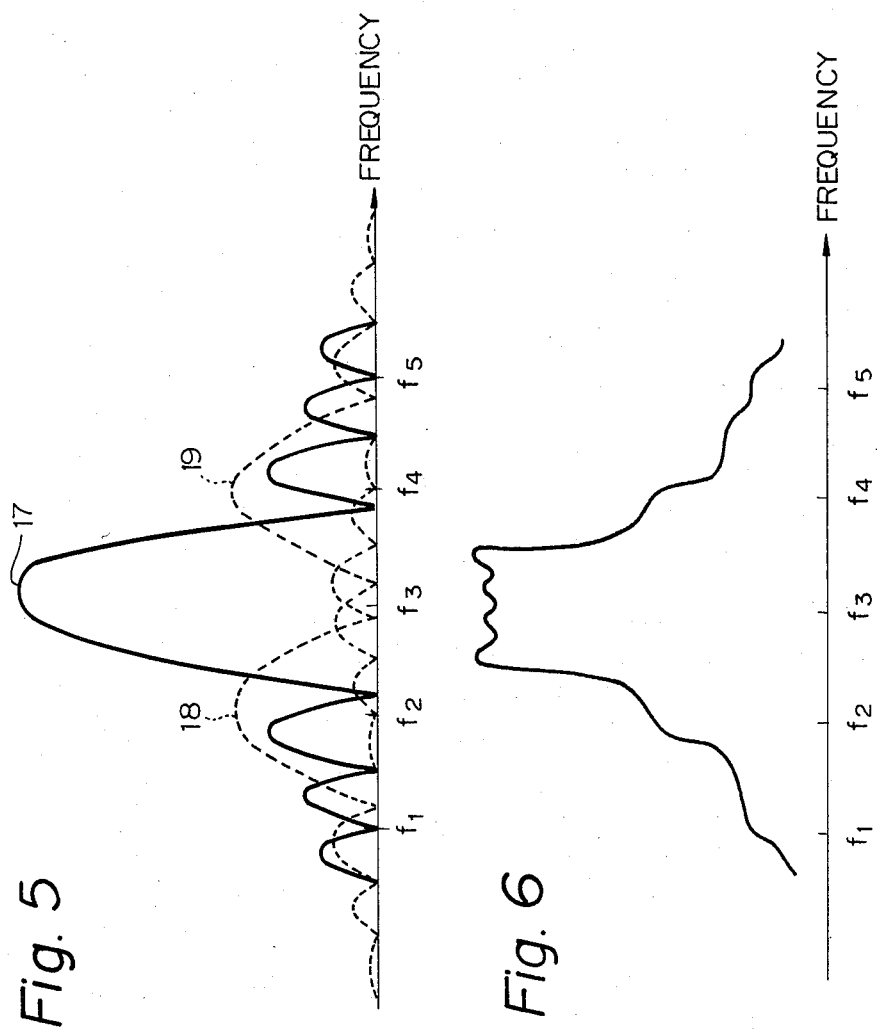
FIG. 5 shows frequency characteristics of three acoustic surface waves received by the output transducer 8 of the filter $F_3$.
FIG. 6 shows the curve of the resultant characteristics of the filter $F_3$.

It is assumed that the acoustic surface wave filter bank of the embodiment consists of five filters $F_1$, $F_2$, $F_3$, $F_4$ and $F_5$ as shown in FIG. 1, and the center frequencies $f_1$ through $f_5$ of those filters satisfy the inequality ($f_1 < f_2 < f_3 < f_4 < f_5$). Further, it is assumed that the ideal frequency characteristics of the acoustic surface wave filter bank are given by FIG. 2.

There are seven kinds of allocation order in a package in which the center frequencies of the adjacently located filters are not adjacent to the center frequency of the present filter as shown in Table 1.

TABLE 1

| Number | Allocation order in a package | Center frequency separation between adjacently located filters |
|---|---|---|
| 1 | $F_1$ $F_3$ $F_5$ $F_2$ $F_4$ | 2, 2, 3, 2 |
| 2 | $F_1$ $F_4$ $F_2$ $F_5$ $F_3$ | 3, 2, 3, 2 |
| 3 | $F_2$ $F_4$ $F_1$ $F_3$ $F_5$ | 2, 3, 2, 2 |
| 4 | $F_2$ $F_4$ $F_1$ $F_5$ $F_3$ | 2, 3, 4, 2 |
| 5 | $F_2$ $F_5$ $F_3$ $F_1$ $F_4$ | 3, 2, 2, 3 |
| 6 | $F_3$ $F_1$ $F_4$ $F_2$ $F_5$ | 2, 3, 2, 3 |
| 7 | $F_3$ $F_1$ $F_5$ $F_2$ $F_4$ | 2, 4, 3, 2 |

The table 1 also shows the separation of center frequencies of adjacently located filters, in such a way that the center frequency separation of the filters $F_2$ and $F_5$ is expressed as 3 (=5−2).

Figure 8A:
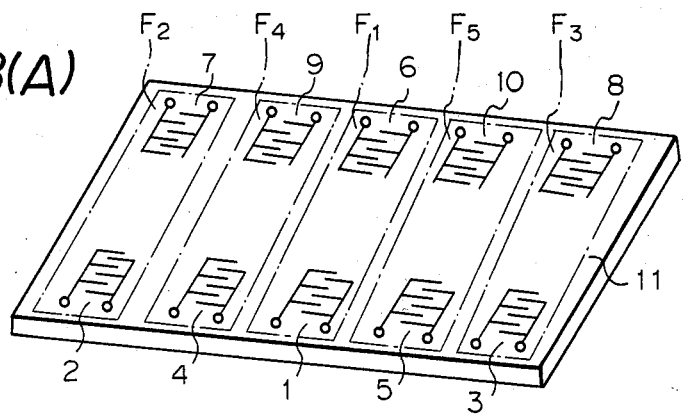
FIGS. 8A, 8B and 8C show structure of an acoustic surface wave filter bank of a first embodiment of this invention.
Figure 8B:
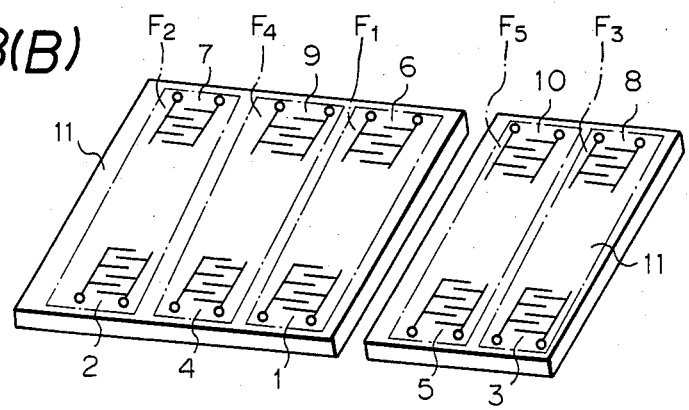
Figure 8C:
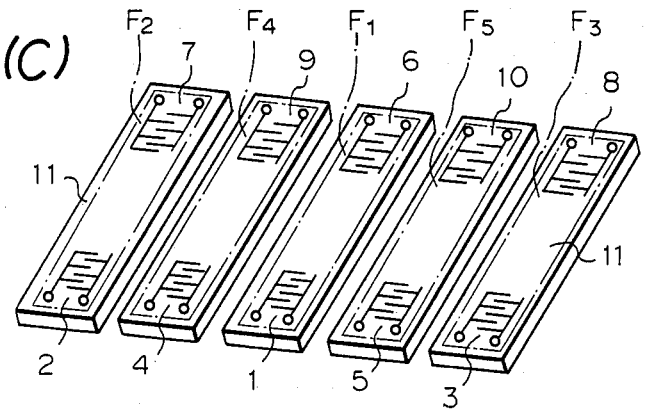
Figure 9A:
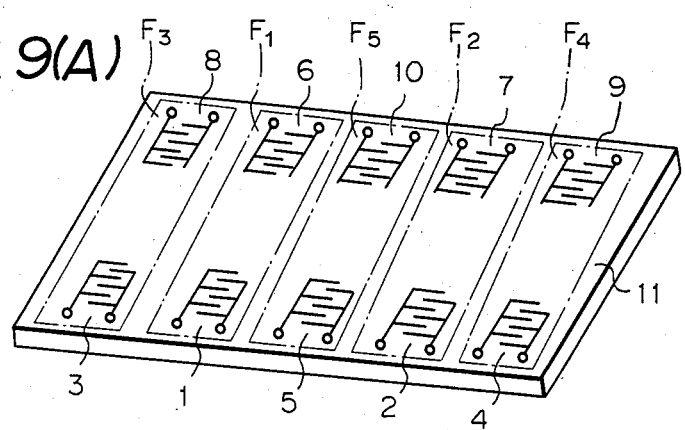
FIG. 9A, 9B and 9C show structure of an acoustic surface wave filter bank of a second embodiment of this invention.
Figure 9B:
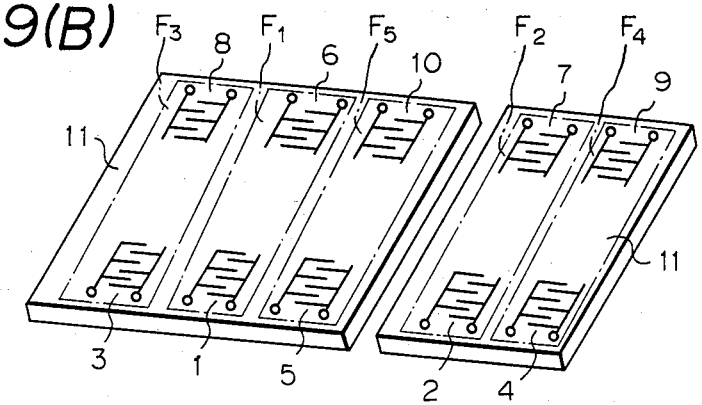
Figure 9C:
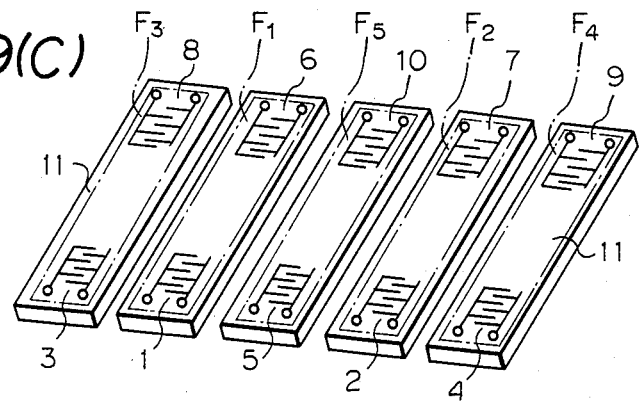

It should be noted that acoustic surface waves leaked from input transducers of adjacently located filters suffer considerably attenuation in an output transducer of the present filter, if the center frequency separation is large. Therefore, when there exists a plurality of allocation order, the most desired allocation order is the one which has the maximum center frequency separation. In the case of Table 1, the allocation order No. 4 shows in FIGS. 8A, 8B, 8C and No. 7 shown in FIGS. 9A, 9B, 9C are the most preferable.

For the acoustic surface wave filter bank with allocation order No. 4, the frequency characteristics of acoustic surface waves which are received by respective output transducers are shown in FIG. 7. In the figure, (A), (B), (C), (D), and (E) show the frequency characteristics of the acoustic surface waves received by the output transducers of the filters $F_2$, $F_4$, $F_1$, $F_5$ and $F_3$, respectively. Solid lines in FIG. 7 show the frequency characteristics of the acoustic surface wave received by an output transducer transmitted from the input transducer of the same filter. Dotted lines in FIG. 7 show the frequency characteristics of the acoustic surface wave received by an output transducer transmitted from the input transducers of the adjacently located filters.

It should be noted that in FIG. 7 acoustis surface waves leaked from adjacently located filters suffer considerable attenuation in an output transducer, since the difference in the center frequencies of the adjacently located filters and the output transducer is large. Therefore, the frequency characteristics close to the ideal one shown in FIG. 2 may be obtained.

As described above, by separating the center frequencies of the adjacently located filters as much as possible, the effects of the leaked acoustic surface wave are minimized, and an excellent surface wave filter bank having a small size is obtained.

From the foregoing it will now be apparent that a new and improved acoustic surface wave filter bank has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. An acoustic surface wave filter bank, comprising:
   at least one piezoelectric substrate having a plurality of acoustic surface wave filters fabricated thereon, each acoustic surface wave filter comprising an input interdigital transducer and an output interdigital transducer, wherein representative center frequencies ($f_1$, $f_2$, $f_3$, $f_4$, $f_5$, where $f_1 < f_2 < f_3 < f_4 < f_5$) of each acoustic surface wave filter are different from one another,
   wherein said filters are allocated in a package so that center frequencies of adjacently located filters are not adjacent to one another, with respect to frequency,
   wherein said filters are allocated with no isolation means between adjacent filters, and
   wherein said filters are allocated such that the maximum center frequency separation is obtained among all the allocated combination of filters.

2. An acoustic surface wave filter bank according to claim 1, wherein said bank has five filters.

3. An acoustic surface wave filter bank according to claim 2, wherein five filters ($F_1$, $F_2$, $F_3$, $F_4$, $F_5$) each having center frequencies ($f_1$, $f_2$, $f_3$, $f_4$, $f_5$) where $f_1 < f_2 < f_3 < f_4 < f_5$ is satisfied, are allocated in a package in sequence of ($F_2$, $F_4$, $F_1$, $F_5$, $F_3$).

4. An acoustic surface wave filter bank according to claim 2, wherein five filters ($F_1$, $F_2$, $F_3$, $F_4$, $F_5$) each having center frequencies ($f_1$, $f_2$, $f_3$, $f_4$, $f_5$) where $f_1 < f_2 < f_3 < f_4 < f_5$ is satisfied, are allocated in a package in sequence $F_3$, $F_1$, $F_5$, $F_2$, $F_4$.

* * * * *